United States Patent
Wu et al.

(10) Patent No.: US 6,876,148 B2
(45) Date of Patent: Apr. 5, 2005

(54) ORGANIC LIGHT-EMITTING PANEL AND MANUFACTURING METHOD THEREOF

(75) Inventors: Chin-long Wu, Tainan (TW); Sung-Yi Pai, Taichung (TW); Tien-wang Huang, Taoyuan (TW)

(73) Assignee: RITdisplay Corporation, Hsinchu (TW)

( * ) Notice: Subject to any disclaimer, the term of this patent is extended or adjusted under 35 U.S.C. 154(b) by 216 days.

(21) Appl. No.: 10/321,358

(22) Filed: Dec. 18, 2002

(65) Prior Publication Data

US 2004/0032209 A1 Feb. 19, 2004

(30) Foreign Application Priority Data

Aug. 19, 2002 (TW) ........................................ 91118724 A

(51) Int. Cl.[7] .......................... H05B 33/04; H05B 33/14
(52) U.S. Cl. .......................... 313/512; 313/46; 313/506
(58) Field of Search ................................ 313/512, 511, 313/504–506, 498, 46, 17, 18, 20, 28, 33

(56) References Cited

U.S. PATENT DOCUMENTS

| | | | | |
|---|---|---|---|---|
| 5,909,081 A | * | 6/1999 | Eida et al. ................... | 313/504 |
| 6,201,346 B1 | * | 3/2001 | Kusaka ........................ | 313/504 |
| 6,242,858 B1 | * | 6/2001 | Sun ............................. | 313/503 |
| 6,605,826 B2 | * | 8/2003 | Yamazaki et al. ............. | 257/72 |
| 6,667,567 B2 | * | 12/2003 | Fujishiro ..................... | 313/46 |
| 6,686,063 B2 | * | 2/2004 | Kobayashi ................... | 428/690 |
| 6,750,599 B2 | * | 6/2004 | Tajima ........................ | 313/292 |
| 6,777,621 B2 | * | 8/2004 | Ishikawa et al. ............ | 174/260 |
| 6,819,045 B2 | * | 11/2004 | Okita et al. ................. | 313/511 |

* cited by examiner

*Primary Examiner*—Joseph Williams
*Assistant Examiner*—Dalei Dong
(74) *Attorney, Agent, or Firm*—Birch, Stewart, Kolasch, & Birch, LLP

(57) ABSTRACT

An organic light-emitting panel includes a rear board, a heat spreader and a front board. In this case, the rear board has a first surface and a second surface opposite to the first surface. The heat spreader covers over the first surface and extends to the second surface. The heat spreader, which covers over the first surface of the rear board is formed with plural holes. The front board is set on the first surface and the heat spreader. The invention also discloses a manufacturing method of the panel. The method includes the steps of: fitting a rear board into a heat spreader in such a manner that the heat spreader covers over a first surface of the rear board and extends to a second surface opposite to the first surface of the rear board; and adhering a front board to the first surface of the rear board and the heat spreader.

10 Claims, 6 Drawing Sheets

ORGANIC LIGHT-EMITTING PANEL AND MANUFACTURING METHOD THEREOF

BACKGROUND OF THE INVENTION

1. Field of the Invention

The invention relates to an organic light-emitting panel and a manufacturing method thereof and, in particular, to an organic light-emitting panel, in which the heat dissipation paths and area may be improved, and a manufacturing method thereof.

2. Description of the Related Art

In the conventional methods for packaging organic light-emitting diodes, wire layout is made on a surface of the electroconductive glass. In this method, however, pins only can be formed on a periphery of the electroconductive glass. Thus, the large-scale demands for the organic light-emitting diodes cannot be satisfied, and the resolution of the organic light-emitting diodes is further limited. Meanwhile, heat generated from the organic light-emitting diodes is almost concentrated on the middle of the device, and the problem of poor heat dissipation paths is also caused.

Another method for packaging organic light-emitting diodes is called as an array area method, in which solder balls and pins serve as metal conductors. Although the method may solve the problem of large-scale devices, there are some practical problems to be overcome because the printed circuit board (i.e., rear board) cannot bear the warpage caused by the high-temperature condition during the high-temperature reflowing process.

Because about 90% of electric power inputted to the organic light-emitting diodes is converted into heat, removing redundant heat from the organic light-emitting diodes is a big problem to be solved. The above-mentioned package methods have the following drawbacks. First, the heat dissipation paths and the radiation area of the organic light-emitting panel are not sufficient, and in particular, when the rear board is a plastic substrate with a high thermal resistance, the heat cannot be effectively radiated. Second, because the rear board may warp, the dimensional stability of the rear board may be influenced.

SUMMARY OF THE INVENTION

An objective of the invention is to provide an organic light-emitting panel, in which the heat dissipation paths may be increased and the radiation area may be enlarged so as to avoid warpage of the rear board and facilitate the adhesive dispensing process, and a manufacturing method of the panel.

To achieve the above-mentioned objective, the invention provides an organic light-emitting panel including a rear board, a heat spreader and a front board. The rear board has a first surface and a second surface opposite to the first surface. The heat spreader covers over the first surface of the rear board and extends to the second surface of the rear board. The heat spreader, which covers over the first surface of the rear board is formed with plural holes. The front board is set on the heat spreader and the first surface of the rear board.

In addition, the invention also provides a manufacturing method of the organic light-emitting panel. The method includes the steps of: fitting a rear board into a heat spreader in a such manner that the heat spreader covers over a first surface of the rear board and extends to a second surface opposite to the first surface of the rear board; and adhering a front board to the first surface of the rear board and the heat spreader.

Compared to the prior art, owing to the increased heat dissipation paths and enlarged radiation area, heat generated from the front board may be effectively transferred to the rear board and then dissipated. In addition, since the rear board is fitted into the heat spreader with the second surface of the rear board partially exposed, stresses generated during the warpage of the rear board may be absorbed and the dimensional stability of the rear board may be enhanced. Therefore, the drawbacks caused by the warpage of the rear board may be overcome. Furthermore, since the heat spreader is formed with plural holes, it is possible to prevent the conductive adhesive from overflowing during the adhesive dispensing process, and good smoothness of the conductive adhesive may be obtained.

BRIEF DESCRIPTION OF THE DRAWINGS

The invention will become more fully understood from the detailed description given in the herein below illustration, and thus are not limitative of the present invention, and wherein.

DETAILED DESCRIPTION OF THE INVENTION

The organic light-emitting panel and the manufacturing method thereof in accordance with preferred embodiments of the invention will be described with reference to the accompanying drawings, wherein the same reference numbers denote the same elements.

Figure 1:
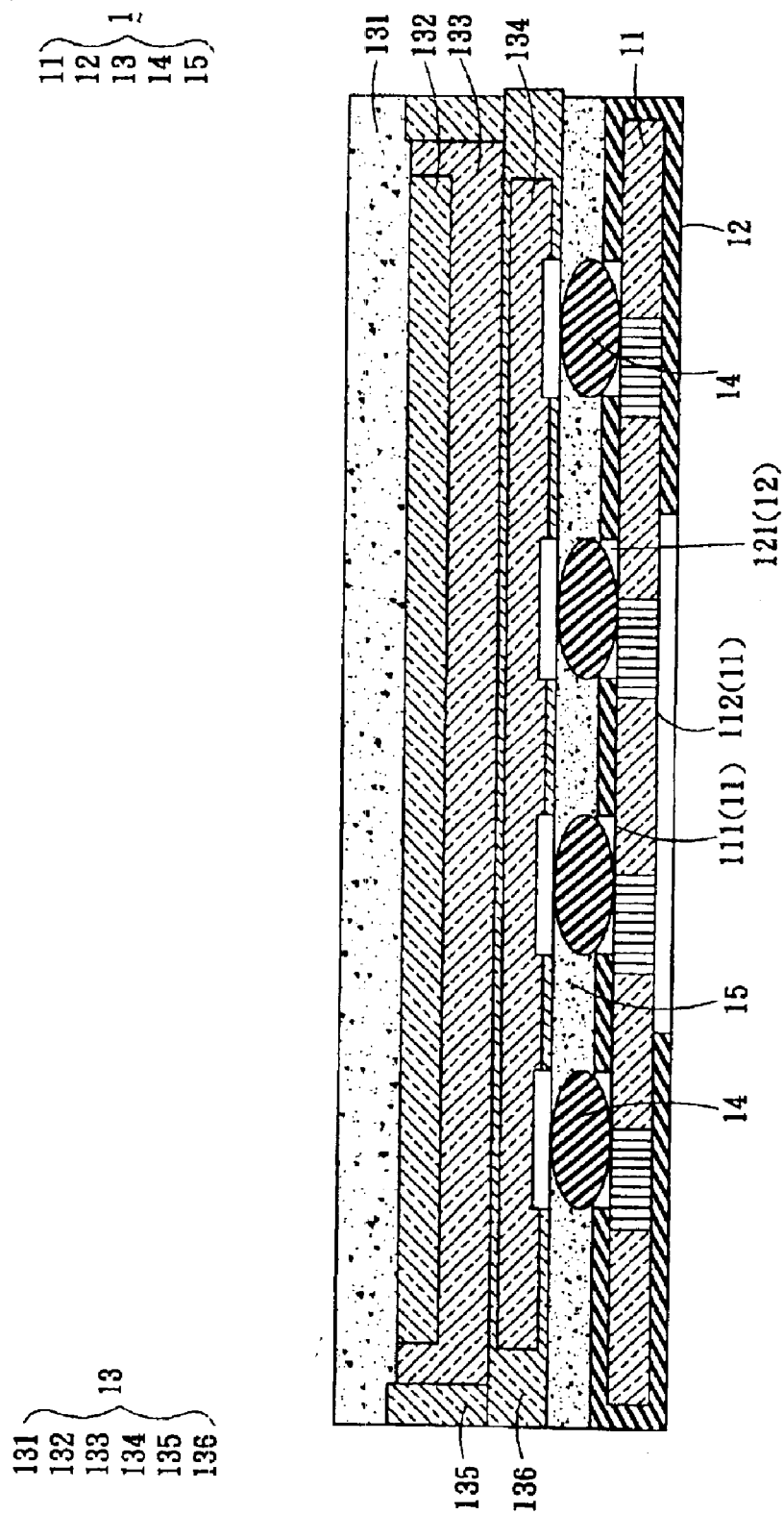
FIG. 1 is a schematic illustration showing the organic light-emitting panel according to one embodiment of the invention.

Referring to FIG. 1, an organic light-emitting panel 1 according to one embodiment of the invention includes a rear board 11, a heat spreader 12 and a front board 13. The rear board 11 has a first surface 111 and a second surface 112 opposite to the first surface 111. The heat spreader 12 covers over the first surface 111 of the rear board 11 and extends to the second surface 112 of the rear board 11. The heat spreader 12, which covers over the first surface 111 of the rear board 11 is formed with plural holes 121. The front board 13 is set on the first surface 111 covered by the heat spreader 12.

Figure 2:
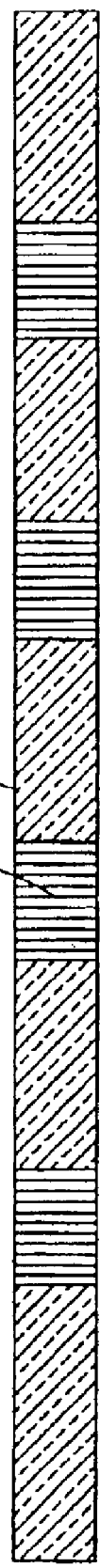
FIG. 2 is a schematic illustration showing a rear board of this embodiment.

As shown in FIG. 2, the rear board 11 of the embodiment is a printed circuit board (PCB) having internal circuits 113. The printed circuit board is typically formed by plating with a layer of copper foil on a laminated board made of a composite material and then etching the copper foil. The composite material is composed of reinforced fibers and resin.

Figure 3A:
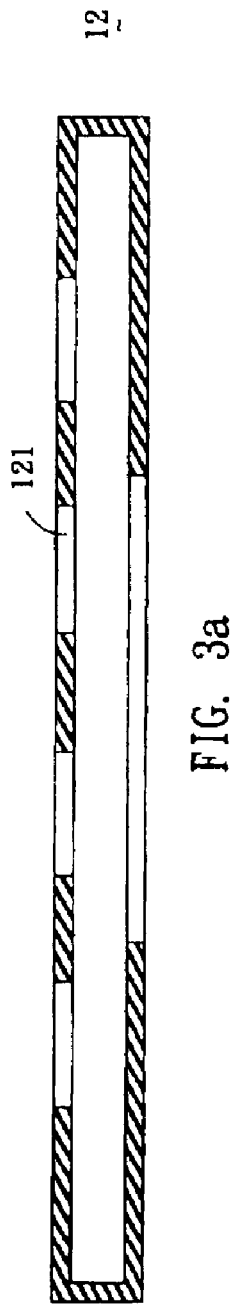
FIG. 3a is a schematic, cross-sectional view showing a heat spreader of this embodiment.
Figure 3B:
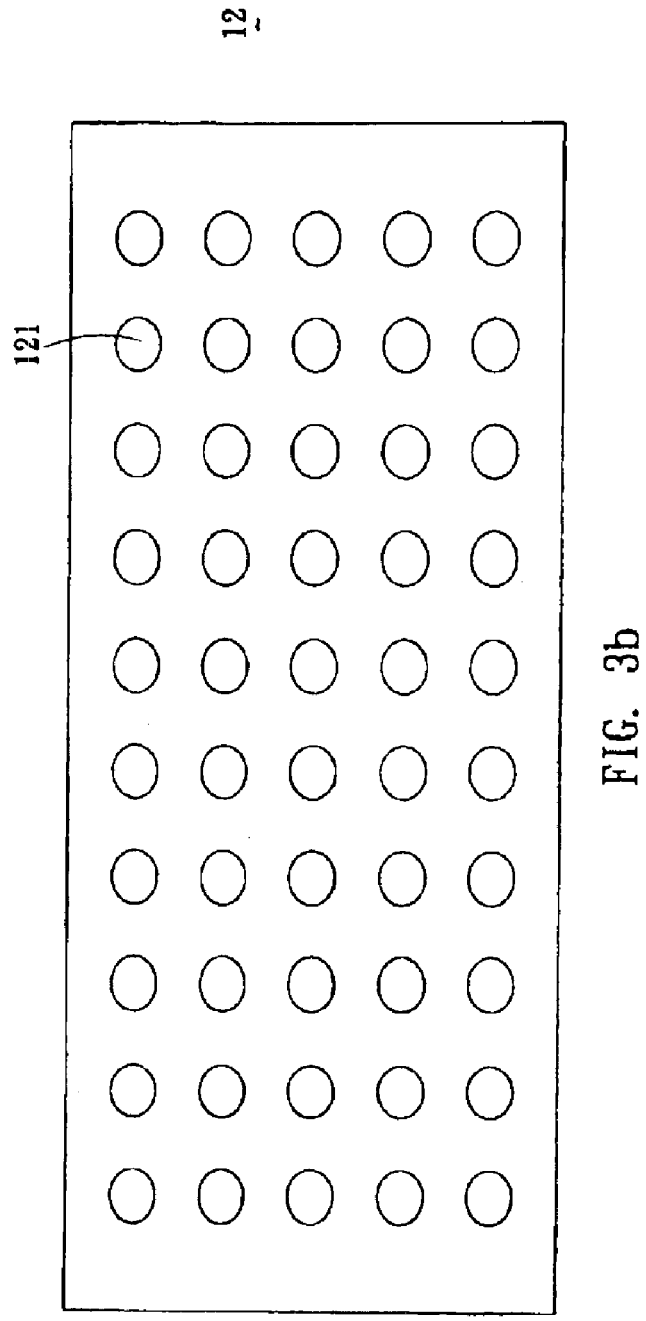
FIG. 3b is a top view showing the heat spreader of this embodiment.

Please refer to FIG. 3a, which is a cross-sectional view showing the heat spreader 12, and also to FIG. 3b, which is a top view showing the heat spreader 12. The heat spreader 12 of this embodiment is made by way of extrusion followed by a surface isolating treatment to make the heat spreader 12 isolated. The heat spreader 12 functions to increase the heat dissipation paths and enlarge the radiation area of the organic light-emitting panel so as to effectively transfer heat generated from the front board 13 to the rear board 11 and then dissipate the heat.

In this case, the heat spreader 12 is made of a metal of, for example, aluminum or copper. The surface of the heat spreader 12 is formed with an oxide of this metal to avoid the short-circuited condition caused by electroconductive traces formed between the internal circuits 113 of the rear board 11 and the cathode 134 (FIG. 5) of the front board 13.

Figure 4:
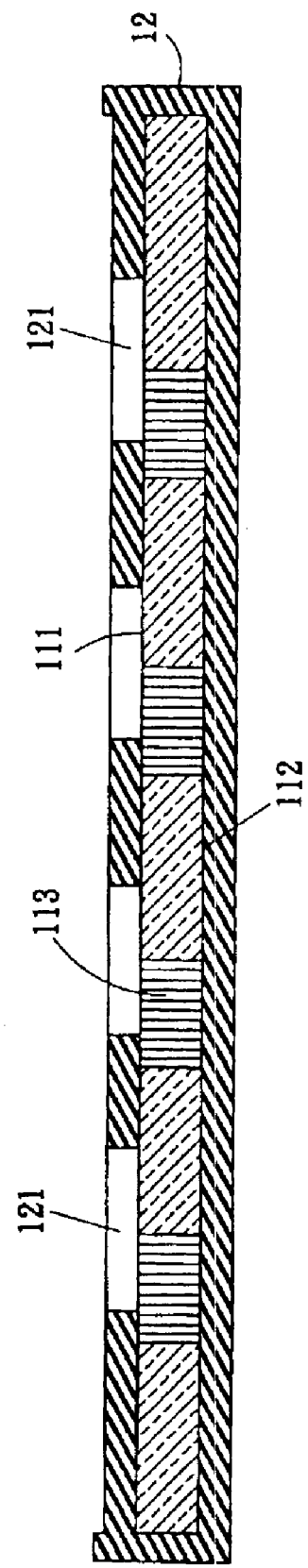
FIG. 4 is a schematic illustration showing the rear board covered by the heat spreader of this embodiment.

Referring to FIG. 4, the beat spreader 12 of this embodiment covers over the first surface 111 of the rear board 11 and extends to the second surface 112 of the rear board 11. In this case, the rear board 11 may be fitted into the heat spreader 12. The heat spreader 12, which covers over the first surface 111 of the rear board 11 is formed with plural holes 121. The positions of the holes 121 depend on the relative position relationship between the internal circuits 113 of the rear board 11 and the cathode 134 (FIG. 5) of the front board 13.

Figure 5:
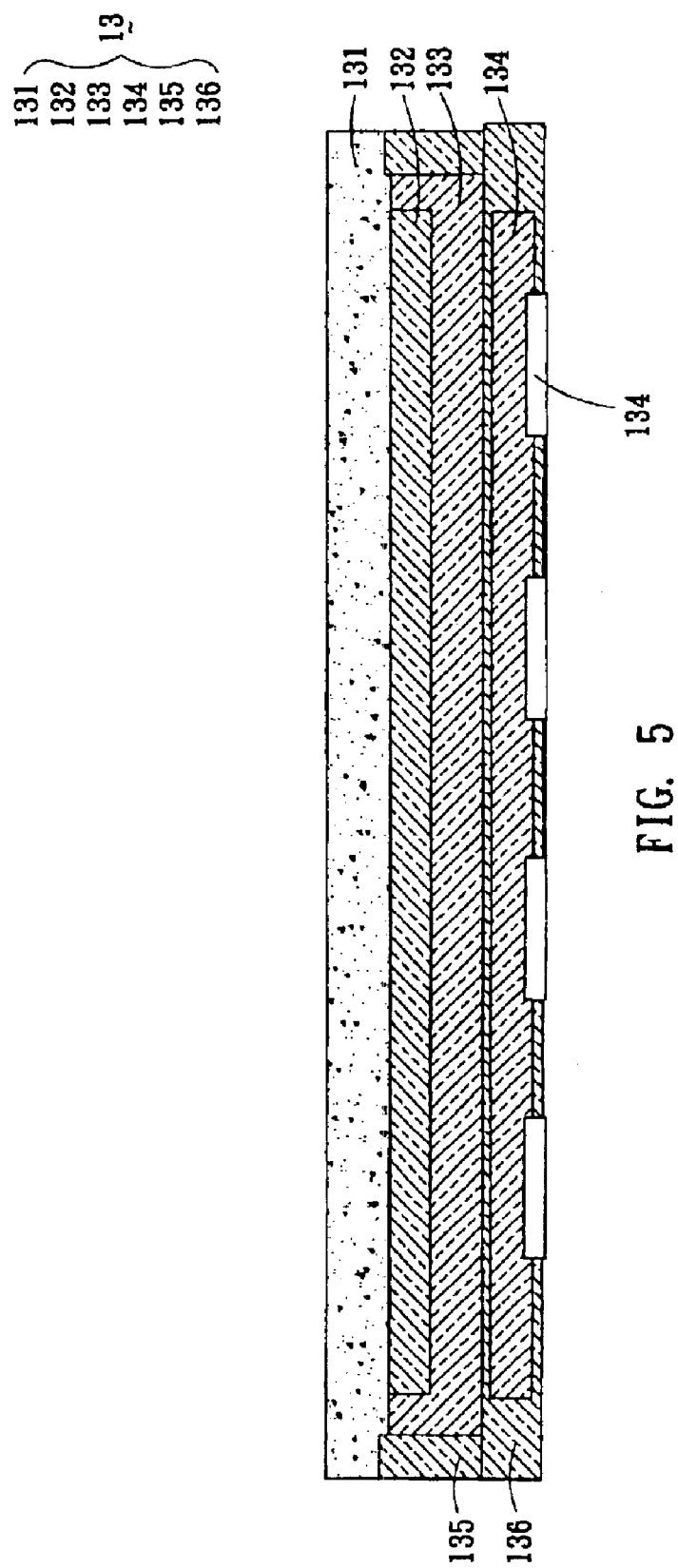
FIG. 5 is a schematic illustration showing a front board of this embodiment.

Referring to FIG. 5, the front board 13 of this embodiment includes a transparent substrate 131, a transparent anode 132, an organic electroluminescence layer 133 and a metal cathode 134. The transparent anode 132 and the organic electroluminescence layer 133 are arranged between the transparent substrate 131 and the cathode 134.

In this case, the transparent substrate 131 may be a glass substrate, a plastic substrate or a flexible substrate. The plastic substrate and the flexible substrate may be a polycarbonate (PC) substrate or a polyester (PET) substrate, and the transparent substrate 131 has a thickness of about 0.2 to 5 mm.

In addition, the transparent anode 132 of this embodiment is formed on the transparent substrate 131 by way of sputtering or ion plating. The transparent anode 132 may be made of an electroconductive metal oxide, which may be indium tin oxide (ITO) or aluminum zinc oxide (AZO) having a thickness of 500 angstroms or more.

The organic electroluminescence layer 133 includes a hole injection layer, a hole transfer layer, a light-emitting layer, an electron transfer layer and an electron injection layer. The organic electroluminescence layer 133 having a thickness of about 500 to 3000 angstroms is formed on the transparent anode 132 by way of evaporating, spin coating, ink jet printing or printing. In addition, light rays emitting from the organic electroluminescence layer 133 may be blue, green, red, white, or other monochromatic colors.

Next, the cathode 134 is formed by way of evaporating, electron-beam coating (E-gun) or sputtering. The cathode 134 has a thickness of about 500 to 5000 angstroms and may be made of aluminum, aluminum/lithium, calcium, magnesium-silver alloy or silver.

Since the organic light-emitting diode is very sensitive to moisture, defects such as dark spots may be easily generated after the organic light-emitting diode contacts the moisture, and the lifetime of the organic light-emitting panel may also be adversely influenced. In this embodiment, after forming the cathode 134, an organic desiccant layer 135 having a thickness of about 1000 to 6000 nm is plated by a CVD (Chemical Vapor Deposition) method. Then, an inorganic desiccant layer 136 having a thickness of about 40 to 450 $\mu$m is plated by the CVD or sputtering method so as to isolate the device from moisture. Next, the cathode 134 is defined by way of wet etching.

Please refer again to FIG. 1. The front board 13 is adhered to the first surface 111 of the rear board 11 and the heat spreader 12 using a conductive adhesive 14 and an adhesive agent 15. In this case, the conductive adhesive 14 is an epoxy resin (silver paste), the electroconductive property of which relates to the coating thickness and area. The adhesive agent 15 is a non-conductive adhesive, the function of which is similar to that of the underfill. In other words, the adhesive agent 15 is used to solve the problem of the global thermal expansion mismatch of the organic light-emitting panel. That is, the rear board 11 is tightly combined with the front board 13 by the adhesive agent 15, and the stresses therebetween are redistributed over the whole region.

Figure 6:
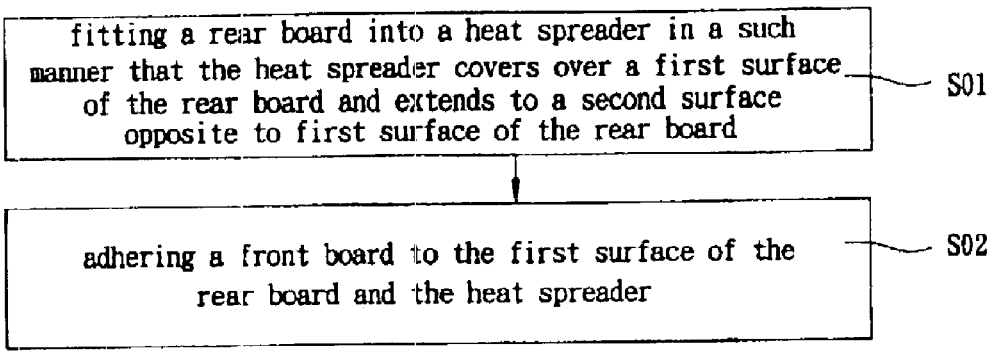
FIG. 6 is a block diagram showing a manufacturing method of an organic light-emitting panel according to another embodiment of the invention.

Referring to FIG. 6, the invention also provides a manufacturing method of the organic light-emitting panel 1. The method includes the steps of: fitting a rear board 11 into a heat spreader 12 in a such manner that the heat spreader 12 covers over a first surface 111 of the rear board 11 and extends to a second surface 112 opposite to first surface 111 of the rear board 11 (S01); and adhering a front board 13 to the first surface 111 of the rear board 11 and the heat spreader 12 (S02).

The elements and functions of the organic light-emitting panel 1 in this embodiment are the same as those of FIG. 1, and detailed descriptions thereof are omitted.

In step S01, the rear board 11 is fitted into the heat spreader 12 in such a manner that holes 121 of the heat spreader 12 are aligned with internal circuits 113 of the rear board 11, respectively.

In this case, the heat spreader 12 is formed by way of press molding. Then, holes 121 are formed at positions corresponding to the cathode 134 of the front board 13 and the internal circuits 113 of the rear board 11 using a chemical or mechanical way. Next, a metal film (i.e., black oxidation) forming method is adopted to form a metal oxide layer having a thickness of 25 to 100 $\mu$m on the surface of the heat spreader 12. In this case, the metal oxide layer is used to avoid the short-circuited condition caused by the electroconductive traces formed between the cathode 134 of the front board 13 and the internal circuits 113 of the rear board 11.

In step S02, the front board 13 is adhered to the first surface 111 of the rear board 11 and the heat spreader 12, and the organic light-emitting panel 1 is thus formed. In this case, a conductive adhesive 14 and an adhesive agent 15 (non-conductive adhesive) are printed on the first surface 111 of the rear board 11 and the heat spreader 12. Next, the front board 13 is placed on the conductive adhesive 14 and the adhesive agent 15.

Because the organic light-emitting panel of the invention includes a heat spreader, the heat dissipation paths of the organic light-emitting panel may be increased and the radiation area thereof may be enlarged. Compared to the prior art, owing to the increased heat dissipation paths and enlarged radiation area, heat generated from the front board may be effectively transferred to the rear board and then dissipated. In addition, since the rear board is fitted into the heat spreader with the second surface of the rear board partially exposed, stresses generated during the warpage of the rear board may be absorbed and the dimensional stability of the rear board may be enhanced. Therefore, the drawbacks caused by the warpage of the rear board may be overcome. Furthermore, since the heat spreader is formed with plural holes, it is possible to prevent the conductive adhesive from overflowing during the adhesive dispensing process, and good smoothness of the conductive adhesive may be obtained.

While the invention has been described by way of an example and in terms of a preferred embodiment, it is to be understood that the invention is not limited to the disclosed embodiment. To the contrary, it is intended to cover various modifications. Therefore, the scope of the appended claims should be accorded the broadest interpretation so as to encompass all such modifications.

What is claimed is:

1. An organic light-emitting panel, comprising:
   a rear board having a first surface and a second surface opposite to the first surface;
   a heat spreader covering over the first surface of the rear board and extending to the second surface of the rear board, the heat spreader which covers over the first surface of the rear board being formed with plural holes; and
   a front board setting on the heat spreader and the first surface of the rear board.

2. The organic light-emitting panel according to claim 1, wherein the front board comprises a transparent substrate, a transparent anode, an organic electroluminescence layer and a cathode, and the transparent anode and the organic electroluminescence layer are arranged between the transparent substrate and cathode.

3. The organic light-emitting panel according to claim 1, wherein the front board is adhered to the rear board and the heat spreader by a conductive adhesive and an adhesive agent.

4. The organic light-emitting panel according to claim 3, wherein the conductive adhesive is an epoxy resin.

5. The organic light-emitting panel according to claim 3, wherein the adhesive agent is a non-conductive adhesive.

6. The organic light-emitting panel according to claim 1, wherein the rear board is a printed circuit board.

7. The organic light-emitting panel according to claim 1, wherein the rear board is fitted into the heat spreader.

8. The organic light-emitting panel according to claim 1, wherein the heat spreader is formed by way of press molding.

9. The organic light-emitting panel according to claim 1, wherein the heat spreader is isolated.

10. The organic light-emitting panel according to claim 1, wherein the heat spreader is made of a metal, and a metal oxide is formed on a surface of the heat spreader.

* * * * *